(12) United States Patent
Cannavo et al.

(10) Patent No.: US 11,371,456 B2
(45) Date of Patent: Jun. 28, 2022

(54) METHOD FOR CONTROLLING A DC-DC VOLTAGE CONVERTER

(71) Applicant: VITESCO TECHNOLOGIES GmbH, Hanover (DE)

(72) Inventors: Jean Cannavo, Toulouse (FR); Thierry Bavois, Toulouse (FR)

(73) Assignee: VITESCO TECHNOLOGIES GMBH, Hannover (DE)

( * ) Notice: Subject to any disclaimer, the term of this patent is extended or adjusted under 35 U.S.C. 154(b) by 0 days.

(21) Appl. No.: 17/257,440

(22) PCT Filed: Jul. 10, 2019

(86) PCT No.: PCT/EP2019/068531
§ 371 (c)(1),
(2) Date: Dec. 31, 2020

(87) PCT Pub. No.: WO2020/011852
PCT Pub. Date: Jan. 16, 2020

(65) Prior Publication Data
US 2021/0277843 A1  Sep. 9, 2021

(30) Foreign Application Priority Data
Jul. 10, 2018 (FR) ...................................... 1856305

(51) Int. Cl.
*F02D 41/20* (2006.01)
*H02M 1/00* (2006.01)
(Continued)

(52) U.S. Cl.
CPC ........... *F02D 41/20* (2013.01); *F02D 41/182* (2013.01); *H02M 1/0009* (2021.05);
(Continued)

(58) Field of Classification Search
CPC ............ F02D 41/20; F02D 2041/2003; F02D 2041/2006; F02D 2041/2051; H02M 1/0009
See application file for complete search history.

(56) References Cited

U.S. PATENT DOCUMENTS

| 11,111,892 B2* | 9/2021 | Schoefbaenker | ...... F02M 51/06 |
| 2008/0316670 A1* | 12/2008 | Matsuura | ................ F02D 41/20 361/152 |

(Continued)

FOREIGN PATENT DOCUMENTS

| JP | 2013-087717 | 5/2013 |
| WO | 2015/037321 | 3/2015 |

OTHER PUBLICATIONS

International Search Report for PCT/EP2019/068531 dated Sep. 3, 2019, 7 pages.
(Continued)

*Primary Examiner* — Erick R Solis
(74) *Attorney, Agent, or Firm* — Nixon & Vanderhye

(57) ABSTRACT

Disclosed is a method for controlling a DC-DC voltage converter for current-driving at least one fuel injector of a motor vehicle internal combustion engine. The method notably includes the steps of determining a time referred to as the "recovery" time at which the output voltage crosses the predefined high voltage threshold, of determining a time referred to as the "drop" time, corresponding to the start of injection, at which the output voltage decreases below the predefined high voltage threshold, and of calculating the time elapsed between the recovery time and the drop time.

20 Claims, 2 Drawing Sheets

(51) Int. Cl.
  *F02D 41/18* (2006.01)
  *H02M 3/157* (2006.01)
  *H03K 17/082* (2006.01)
(52) U.S. Cl.
  CPC ........ *H02M 3/157* (2013.01); *H03K 17/0822* (2013.01); *F02D 2041/2003* (2013.01); *F02D 2041/2051* (2013.01)

(56) References Cited

U.S. PATENT DOCUMENTS

2009/0015230 A1   1/2009  Alessandro et al.
2018/0138812 A1   5/2018  Rose et al.
2021/0277844 A1*  9/2021  Cannavo ................ H02M 1/32

OTHER PUBLICATIONS

Written Opinion of the ISA for PCT/EP2019/068531 dated Sep. 3, 2019, 7 pages.

* cited by examiner

METHOD FOR CONTROLLING A DC-DC VOLTAGE CONVERTER

CROSS-REFERENCE TO RELATED APPLICATIONS

This application is the U.S. national phase of International Application No. PCT/EP2019/068531 filed Jul. 10, 2019 which designated the U.S. and claims priority to FR 1856305 filed Jul. 10, 2018, the entire contents of each of which are hereby incorporated by reference.

BACKGROUND OF THE INVENTION

Field of the Invention

The present invention relates to the field of DC-DC voltage converters, and more particularly to a DC-DC voltage converter intended to be located on board an internal combustion engine motor vehicle, for example with a view to delivering the energy required to drive the fuel injectors, as well as to a method for controlling such a DC-DC voltage converter.

Description of the Related Art

In an internal combustion engine motor vehicle, it is known practice to use a DC-DC voltage converter to deliver the energy required to drive the fuel injectors. Such a converter notably allows the voltage delivered by the battery of the vehicle, about 12 V for example, to be converted into a higher target output voltage, 65 V for example, that allows recharging of a capacitor, referred to as the intermediate capacitor, that is connected to the output of the converter and that delivers current to a control module allowing, on command by a computer, the fuel injectors to be activated.

Thus, when the computer commands the control module, the latter uses the current delivered by the intermediate capacitor to drive the fuel injectors. In so doing, the intermediate capacitor discharges and the converter then activates to recharge it until the output voltage returns to its target value.

The internal operating principle of the converter consists in charging a coil with the current delivered by the battery and in cutting the current cyclically, using a switch, especially a transistor, an MOS transistor for example. When the switch is closed, the coil charges, and when the switch is open, the energy stored in the coil is transmitted in the form of a current to the intermediate capacitor in order to recharge it. The alternation of the closed and open states of the switch thus generates a sawtooth current, called the peak current.

The amplitude of this peak current allows the output voltage to rise at a greater or lesser rate. Thus, when the amplitude of the peak current is high, the output voltage of the converter rises rapidly after a voltage drop and, conversely, when the amplitude of the peak current is low, the output voltage of the converter rises slowly. In both cases, the converter ceases to produce the peak current when the output voltage reaches its target value.

In order to allow the command of the converter so that the output voltage rises to its target value, it is known practice to connect a control module between the output and the input of the converter, a PID or bang-bang module for example, which are well known to a person skilled in the art. Bang-bang control consists in measuring the output voltage and in commanding the amplitude of the peak current to its maximum threshold when it is necessary to rapidly increase the output voltage of the converter to its target value and in commanding the stopping of the peak current when the measured output voltage of the converter is equal to its target value. Now, this type of control rapidly compensates the output voltage but entails mediocre efficiency from the converter because of the use of the converter in a binary manner at its maximum power or at stop (referred to as "on/off" mode), which is a significant disadvantage.

In order to overcome this disadvantage, PID control is used, which consists in measuring the output voltage of the converter and in increasing it or decreasing it step by step in accordance with the change in the value of the output voltage. However, in a vehicle internal combustion engine, it is known practice to use multiple commands for the injectors to optimize the injection of fuel. As these injections must be significantly clustered, it is necessary to command the converter in a rapid manner. Now, in such a situation of clustered injections, PID control may prove to be insufficiently rapid, such that the output voltage will not have reached its target value when a new injection command is triggered, which may lead to an ineffective injection of fuel, which may damage the engine and is again a significant disadvantage.

SUMMARY OF THE INVENTION

There is therefore a need for a simple, rapid, reliable, inexpensive and effective solution for optimizing command of the amplitude of the peak current of the converter.

To this end, the first subject of the invention is a method for controlling a DC-DC voltage converter for current-driving at least one fuel injector of a motor vehicle internal combustion engine, said converter comprising a control module and an induction coil that is connected to a field-effect transistor comprising a drain, a source and a gate, said gate being connected to the control module in order for said control module to command the transistor to an on state in which current passes between the drain and the source or to an off state in which current does not pass between the drain and the source, the alternation of the on and off states of the transistor generating a sawtooth current called the peak current, the amplitude of which varies between 0 and a variable maximum amplitude value that is bounded by a minimum threshold and a maximum threshold and that allows the converter to deliver an output voltage across the terminals of a capacitor called the "intermediate" capacitor, the discharging of which is commanded by a computer via a drive module in order to command at least one fuel injector, the converter being configured to make said output voltage tend toward a target value, the method being characterized in that it comprises:

a step of determining a time referred to as the "recovery" time at which the output voltage crosses a predefined high voltage threshold, a step of determining a time referred to as the "drop" time, corresponding to the start of injection, at which the output voltage decreases below the predefined high voltage threshold, a step of calculating the time elapsed between the recovery time and the drop time, if the calculated time is above a predefined time threshold, referred to as the "target" time threshold, and if the value of the maximum amplitude of the peak current is above the minimum threshold, a step of decreasing the value of the maximum amplitude of the peak current, if the calculated time is below said target time threshold and if the value of the maximum amplitude of the peak current is below the maximum threshold, a step of increasing the value of the maximum amplitude of the peak current.

The method according to the invention thus allows the rise of the output voltage to be adjusted such that the latter occurs as close as possible to but prior to the next voltage drop triggered by a fuel injection request. This notably avoids having to systematically command the rise of the output voltage from a value equal to the maximum amplitude threshold of the peak current as in the case of bang-bang control and thus significantly improves the efficiency of the converter. Moreover, this allows the rise in the output voltage to be commanded with precision such that it occurs rapidly and without too significant a delay, as may be the case when using PID control.

Preferably, the target time threshold is adjustable in order to optimize the choice between an increase or a decrease in the maximum amplitude value of the peak current and thus to optimize the efficiency of the converter while retaining a sufficient safety margin with respect to the variations of the system. For example, the target time threshold may be between 200 and 500 μs.

Advantageously, the maximum amplitude value of the peak current is decreased by decrementing by a predefined value corresponding to a fraction of the maximum amplitude threshold of the peak current. This predefined value may be chosen so as to allow a more or less rapid decrease in the maximum amplitude value of the peak current in order to optimize the efficiency of the converter. For example, this predefined value may be a multiple of 0.4% (when the value of the current is coded on 8 bits) of the maximum amplitude threshold of the peak current.

Advantageously again, the maximum amplitude value of the peak current is increased by incrementing by a predefined value corresponding to a fraction of the maximum amplitude threshold of the peak current. This predefined value may be chosen so as to allow a more or less rapid increase in the maximum amplitude value of the peak current in order to optimize the efficiency of the converter. For example, this predefined value may be a multiple of 0.4% (8 bits) of the maximum amplitude threshold of the peak current.

Preferably, the predefined decrement value is equal to the predefined increment value in order to simplify the algorithm of the control module implementing this part of the method.

According to one aspect of the invention, the method furthermore comprises a step of measuring the time elapsed from the drop time and, when the output voltage has not crossed the predefined high voltage threshold at the end of a predefined time threshold referred to as the "rise" time threshold, a step of increasing the value of the maximum amplitude of the peak current to the maximum amplitude threshold in order to allow as rapid as possible a rise in the output voltage beyond the predefined high voltage threshold.

Advantageously, when the output voltage has crossed the predefined high voltage threshold, when the calculated time is above the target time threshold and when the maximum amplitude value of the peak current is equal to its minimum threshold, the method comprises a step of maintaining the maximum amplitude value of the peak current at its minimum threshold at its next peak.

Advantageously, when the output voltage has crossed the predefined high voltage threshold, when the calculated time is below the target time threshold and when the maximum amplitude value of the peak current is equal to its maximum threshold, the method comprises a step of maintaining the maximum amplitude value of the peak current at its maximum threshold at its next peak.

The invention also relates to a DC-DC voltage converter for current-driving at least one fuel injector of a motor vehicle internal combustion engine, said converter comprising a control module and an induction coil that is connected to a field-effect transistor comprising a drain, a source and a gate, said gate being connected to the control module in order for said control module to command the transistor to an on state in which current passes between the drain and the source or to an off state in which current does not pass between the drain and the source, the alternation of the on and off states of the transistor generating a sawtooth current called the peak current, the amplitude of which varies between 0 and a variable maximum amplitude value that is bounded by a minimum threshold and a maximum threshold and that allows the converter to deliver an output voltage across the terminals of a capacitor referred to as the "intermediate" capacitor, the discharging of which is commanded by a computer via a drive module in order to command at least one fuel injector, the converter being configured to make said output voltage tend toward a target value. The control module is configured to:

determine a time referred to as the "recovery" time at which the output voltage crosses the predefined high voltage threshold, determine a time referred to as the "drop" time, corresponding to the start of injection, at which the output voltage decreases below the predefined high voltage threshold, calculate the time elapsed between the recovery time and the drop time, if the calculated time is above a predefined time threshold, referred to as the "target" time threshold, and if the value of the maximum amplitude of the peak current is above the minimum threshold, decrease the value of the maximum amplitude of the peak current, if the calculated time is below said target time threshold and if the value of the maximum amplitude of the peak current is below the maximum threshold, increase the value of the maximum amplitude of the peak current.

Preferably, the target time threshold is adjustable. For example, the target time threshold may be between 200 and 500 μs.

Advantageously, the converter is configured to decrease the maximum amplitude value of the peak current by decrementing by a predefined value corresponding to a fraction of the maximum amplitude threshold of the peak current.

Advantageously again, the control module is configured to increase the maximum amplitude value of the peak current by incrementing by a predefined value corresponding to a fraction of the maximum amplitude threshold of the peak current.

According to one aspect of the invention, the predefined decrement value is equal to the predefined increment value.

According to one aspect of the invention, the converter is furthermore configured to measure the time elapsed from the drop time and, when the output voltage has not crossed the predefined high voltage threshold at the end of a predefined time threshold referred to as the "rise" time threshold, increase the maximum amplitude value of the peak current to the maximum amplitude threshold of the peak current.

Lastly, the invention relates to a motor vehicle comprising a converter such as presented above.

BRIEF DESCRIPTION OF THE DRAWINGS

Other features and advantages of the invention will become apparent from the following description, given with reference to the appended figures, that are given by way of non-limiting examples and in which identical references are given to similar objects.

DESCRIPTION OF THE PREFERRED EMBODIMENTS

Figure 1:
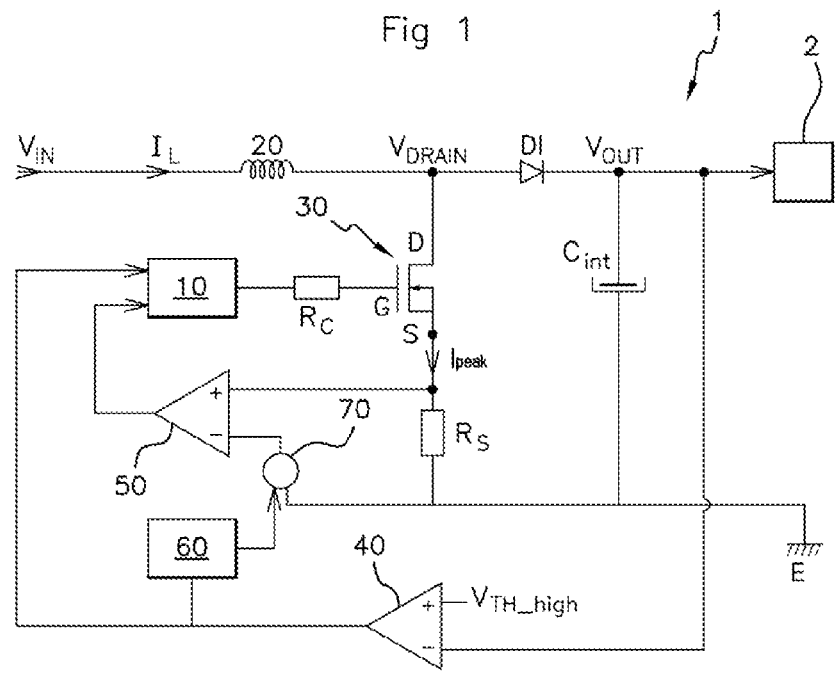
FIG. 1 illustrates one embodiment of the converter according to the invention.

FIG. 1 shows one example of a converter 1 according to the invention. The converter 1 is intended to be installed in a motor vehicle, for example in order to deliver an output voltage Vout allowing fuel injectors 2 to be controlled. The converter 1 is a DC-DC voltage converter.

In the example described hereinbelow, but in a non-limiting manner, the converter 1 is a boost converter 1 that allows recharging of a capacitor referred to as the "intermediate" capacitor Cint that serves to command a drive module 2 for driving the injection of fuel.

The converter 1 converts an input voltage Vin (input current $I_L$) delivered by a power supply, the battery of the vehicle for example, into an output voltage Vout applied across the terminals of the intermediate capacitor Cint, the voltages being measured with respect to ground M. The converter 1 is configured to make the output voltage Vout tend toward a target value Vc (with reference to FIGS. 3 to 5), 65 V for example.

The converter 1 comprises a drive module 10, an induction coil 20, a field-effect transistor 30, a first voltage comparator 40, a second voltage comparator 50, a detection module 60 and a reference voltage 70.

The induction coil 20 is connected at the input of the circuit so as to be charged when it is passed through by the input current $I_L$. A diode DI is connected between the induction coil 20 and the high terminal of the intermediate capacitor Cint that corresponds to the output of the converter 1 connected to the injectors 2. The diode DI is lets current pass from the induction coil 20 to the intermediate capacitor Cint but prevents current from passing from the intermediate capacitor Cint to the induction coil 20 in order to prevent the intermediate capacitor Cint from discharging into the converter 1.

The transistor 30 comprises a drain D, a source S and a gate G, said gate G being connected to the control module 10 in order for said control module 10 to command the transistor 30 to an on state in which current passes between the drain D and the source S or to an off state in which current does not pass between the drain D and the source S. The source is connected to ground via a shunt resistor Rs.

The alternation of the on and off states of the transistor 30 generates a sawtooth current, called the peak current Ipeak.

The peak current Ipeak varies between 0 and a variable maximum amplitude value. The maximum amplitude value is lower bounded by a minimum threshold Ipeak_min and upper bounded by a maximum threshold Ipeak_max.

The alternation of the on and off states of the transistor 30 allows the converter 1 to deliver an output voltage Vout across the terminals of a capacitor referred to as the "intermediate" capacitor, the discharging of which is commanded by a computer via a control module (not shown, called the "injection driver") in order to command at least one fuel injector 2 of the engine of the vehicle.

The drive module 10 allows the transistor 30 to be commanded so that said transistor 30 is in an off state or in an on state. This command is performed on the basis of the results delivered by the first voltage comparator 40 and by the second voltage comparator 50.

The first comparator 40 compares the output voltage Vout of the converter 1 with a predefined voltage threshold referred to as the "high" voltage threshold VTH_high and delivers the result both to the drive module 10 and to the detection module 60.

The converter 1 is active for as long as the output voltage Vout is below the predefined high voltage threshold VTH_high. When the comparator 40 detects that the output voltage Vout of the converter 1 is above the predefined high voltage threshold VTH_high, the comparator 40 sends an exceedance signal to the drive module 10 which then interrupts the operation of the converter 1.

The second comparator 50 compares the voltage defined across the terminals of the shunt resistor Rs (i.e. the voltage representing the peak current Ipeak through the transistor 30) with the voltage defined by the voltage reference 70, which corresponds to a current reference amplitude value called Ipeak_ref, and delivers the result to the drive module 10 in order to control the transistor 30 so as to be in an on or off state.

By contrast, when the value of the voltage defined across the terminals of the shunt resistor Rs is above the value of the voltage defined by the voltage reference 70, then the transistor 30 is off and the current passing through it becomes zero. The operation of the converter subsequently resumes at the end of a predefined time, for example according to the operational frequency of the converter 1, when said converter operates at a fixed frequency. The resumption of the operation of the converter 1 is commanded by the comparator 50.

The detection module 60 is connected between the output of the first voltage comparator 40 and the voltage reference 70 and is configured to detect the passage of the output voltage Vout above or below the predefined high voltage threshold VTH_high and to modify the value of the voltage reference 70, as will be described hereinbelow.

As indicated hereinabove, the voltage reference 70 defines a reference amplitude value Ipeak_ref which will be set by the maximum amplitude of the peak current Ipeak. This reference amplitude value Ipeak_ref is between the minimum amplitude threshold Ipeak_min and the maximum amplitude threshold Ipeak_max of the peak current Ipeak which define the operational range of the converter 1. Notably, the maximum amplitude threshold of the peak current Ipeak defines the maximum power which may be delivered by the converter 1.

The injectors 2 are activated using the current delivered by the intermediate capacitor Cint. The drop in the charge of the intermediate capacitor Cint makes the output voltage Vout of the converter 1 drop.

When the output voltage Vout of the converter 1 passes below the predefined high voltage threshold VTH_high, the converter 1 is activated to make said output voltage Vout rise to its target value Vc.

When the output voltage Vout of the converter 1 increases, the detection module 60 is configured to determine a time referred to as the "recovery" time T1, at which the output voltage Vout crosses the predefined high voltage threshold VTH_high anew.

When the output voltage Vout of the converter 1 decreases following the start of injection of fuel by the injectors 2, the detection module 60 is configured to determine a time referred to as the "drop" time T2, at which the output voltage Vout decreases below the predefined high voltage threshold VTH_high.

The detection module 60 is configured to calculate the time ΔT elapsed between the recovery time T1 and the drop time T2.

When the calculated time ΔT is above a predefined time threshold, referred to as the "target" time threshold ΔT0, and the value of the maximum amplitude of the peak current Ipeak is above the minimum threshold Ipeak_min, the detection module 60 is configured to decrease the value of the maximum amplitude of the peak current Ipeak, within the limit of the minimum threshold Ipeak_min, by lowering the value of the reference voltage 70, that is to say by reducing the value of the reference amplitude Ipeak_ref.

By contrast, when the calculated time ΔT is below said target time threshold ΔT0 and the value of the maximum amplitude of the peak current Ipeak is below the maximum threshold Ipeak_max, the detection module 60 is configured to increase the value of the maximum amplitude of the peak current Ipeak, within the limit of its maximum threshold Ipeak_max, by increasing the value of the reference voltage 70 and therefore the reference amplitude value Ipeak_ref.

The predefined target time threshold ΔT0 corresponds to the time interval between a target time at which it is desired for the output voltage Vout to reach the predefined high voltage threshold VTH_high and the following drop time. Specifically, it is desired for the output voltage to rise to the predefined high voltage threshold VTH_high before the next fuel injection request for optimum efficiency of injection but it is also desired for this rise not to occur too early as that would mean that the value of the maximum amplitude of the peak current Ipeak is too high to effect this voltage rise, which is synonymous with a lower efficiency from the converter 1.

Advantageously, the predefined target time threshold ΔT0 is adjustable and may be between 200 and 500 μs, for example.

In the case of a decrease in the value of the maximum amplitude, the detection module 60 is configured to decrease said value of the maximum amplitude of the peak current Ipeak by decrementing by a predefined value corresponding to a fraction of the maximum threshold Ipeak_max, between 0.2% and 1% for example.

In the case of an increase in the value of the maximum amplitude, the detection module 60 is configured to increase said value of the maximum amplitude of the peak current Ipeak by incrementing by a predefined value corresponding to a fraction of the maximum threshold Ipeak_max, between 0.2% and 1% for example.

Preferably, the predefined decrement value is equal to the predefined increment value.

The detection module 60 is furthermore configured to measure the time elapsed from the drop time T2 and, when the output voltage Vout has not crossed the predefined high voltage threshold VTH_high at the end of a predefined time threshold referred to as the "rise" time threshold ΔT2, increase the value of the maximum amplitude of the peak current Ipeak to the maximum threshold Ipeak_max.

The predefined rise time threshold ΔT2 corresponds to the maximum acceptable time interval between the drop time T2 and the rise of the output voltage Vout to the predefined high voltage threshold VTH_high. Specifically, it is desired for the value of the maximum amplitude of the peak current Ipeak to be as low as possible in order to have the best possible efficiency from the converter 1, but if an unforeseen or strong fuel injection request arises, it is desirable to able to guarantee the efficiency and the rapidity of the converter 1. Preferably, the predefined rise time threshold ΔT2 is configurable according to the minimum time gap between the fuel injections.

One example of an implementation of the converter 1 will now be described with reference to FIGS. 2 to 5.

Figure 3:
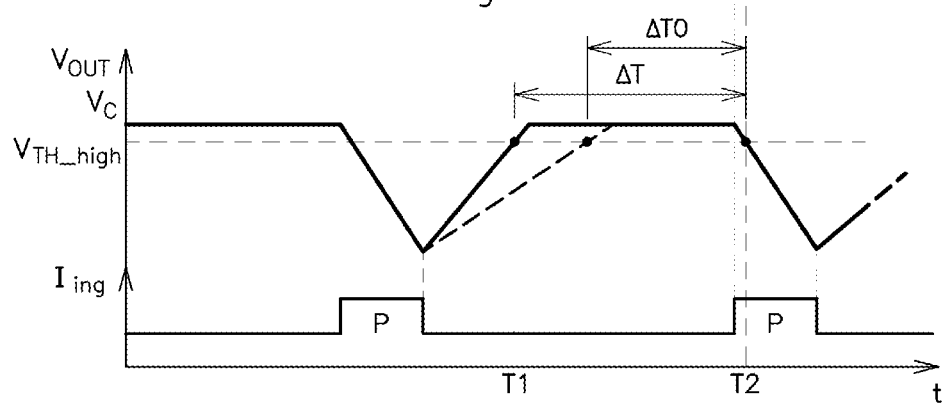
FIG. 3 is a first example of a graph showing the change in the output voltage of the converter.
Figure 4:
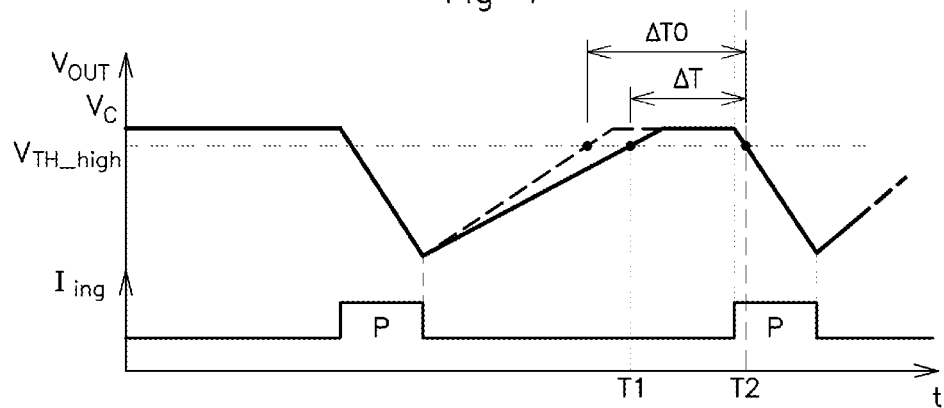
FIG. 4 is a second example of a graph showing the change in the output voltage of the converter.
Figure 5:
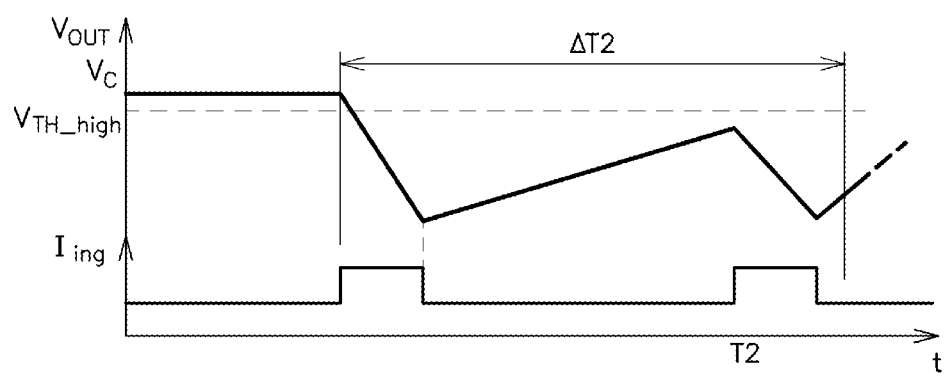
FIG. 5 is a third example of a graph showing the change in the output voltage of the converter.

FIGS. 3 to 5 show the change in the output voltage Vout of the converter 1 over time t as a function of the different injections P represented by pulses in the injection current Iinj supplying the injectors 2.

First of all, in a step S1, the detection module 60 determines a time referred to as the "recovery" time T1 at which the output voltage Vout crosses the predefined high voltage threshold VTH_high.

In a step S2, the detection module 60 determines a time referred to as the "drop" time T2, corresponding to the start of injection, at which the output voltage Vout decreases below the predefined high voltage threshold VTH_high.

Subsequently, in a step S3, the detection module 60 calculates the time ΔT elapsed between the recovery time T1 and the drop time T2.

Figure 2:
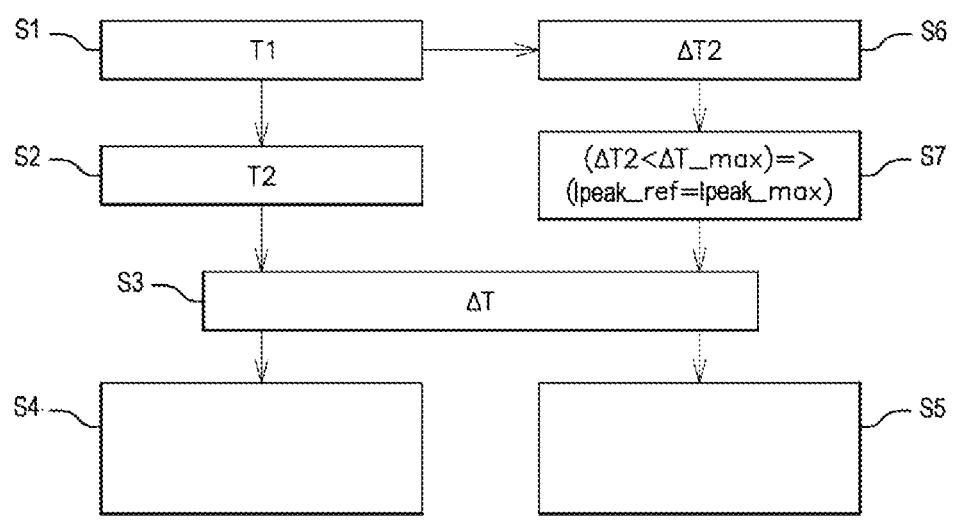
FIG. 2 illustrates one embodiment of the method according to the invention.

With reference to FIGS. 2 and 3, when the calculated time ΔT is above said target time threshold ΔT0 and the value of the maximum amplitude of the peak current Ipeak is above the minimum threshold Ipeak_min, the detection module 60 decreases, in a step S4, the value of the reference voltage 70 by a decrement value in order to decrease the reference amplitude value Ipeak_ref.

With reference to FIGS. 2 and 4, when the calculated time ΔT is below a predefined time threshold, referred to as the "target" time threshold ΔT0, and the value of the maximum amplitude of the peak current Ipeak is below the maximum threshold Ipeak_max, the detection module 60 increases, in a step S5, the value of the reference voltage 70 by an increment value in order to increase the reference amplitude value Ipeak_ref.

When the output voltage Vout of the converter 1 has crossed the predefined high voltage threshold VTH_high, the calculated time ΔT is above the target time threshold ΔT0 and the value of the maximum amplitude of the peak current Ipeak is equal to the minimum threshold Ipeak_min, the detection module 60 maintains said value of the maximum amplitude of the peak current Ipeak at the minimum threshold Ipeak_min during the next peak of the peak current Ipeak.

When the output voltage Vout of the converter 1 has crossed the predefined high voltage threshold VTH_high, the calculated time ΔT is below the target time threshold ΔT0 and the value of the maximum amplitude of the peak current Ipeak is equal to the maximum threshold Ipeak_max, the detection module 60 maintains the value of the maximum amplitude of the peak current Ipeak at the maximum threshold Ipeak_max during the next peak of the peak current Ipeak.

In parallel, the detection module 60 also measures the time elapsed from the drop time T2 (step S6). Thus, in reference to FIG. 5, when the output voltage Vout has not crossed the predefined high voltage threshold VTH_high at the end of a predefined time threshold referred to as the "rise" time threshold ΔT2, the detection module 60 increases the value of the maximum amplitude of the peak current Ipeak to the maximum threshold Ipeak_max for the next peak.

The method according to the invention allows the value of the maximum amplitude of the peak current Ipeak to be adjusted according to the more or less rapid rise of the output voltage Vout of the converter 1 in order to improve the efficiency thereof while at the same time reducing losses and ensuring as rapid as possible a rise in the case of significant injection requests.

The invention claimed is:

1. A method for controlling a DC-DC voltage converter (1) for current-driving at least one fuel injector (2) of a motor vehicle internal combustion engine, said converter (1) comprising a control module (10) and an induction coil (20) that is connected to a field-effect transistor (30) comprising a drain (D), a source (S) and a gate (G), said gate (G) being connected to the control module (10) in order for said control module (10) to command the transistor (30) to an on state in which current passes between the drain (D) and the source (S) or to an off state in which current does not pass between the drain (D) and the source (S), the alternation of the on and off states of the transistor (30) generating a sawtooth current called the peak current (Ipeak), the amplitude of which varies between 0 and a variable maximum amplitude value that is bounded by a minimum threshold (Ipeak_min) and a maximum threshold (Ipeak_max) and that allows the converter (1) to deliver an output voltage (Vout) across the terminals of a capacitor referred to as the "intermediate" capacitor (Cint), the discharging of which is commanded by a computer via a drive module in order to command at least one fuel injector (2), the converter (1) being configured to make said output voltage (Vout) tend toward a target value, the method comprising:

a step (S1) of determining a time referred to as the "recovery" time (T1) at which the output voltage (Vout) crosses a predefined high voltage threshold (VTH_high), a step (S2) of determining a time referred to as the "drop" time (T2), corresponding to the start of injection, at which the output voltage (Vout) decreases below the predefined high voltage threshold (VTH_high), a step (S3) of calculating the time (ΔT) elapsed between the recovery time (T1) and the drop time (T2), if the calculated time (ΔT) is above a predefined time threshold, referred to as the "target" time threshold (ΔT0), and if the value of the maximum amplitude of the peak current (Ipeak) is above the minimum threshold (Ipeak_min), a step (S4) of decreasing the value of the maximum amplitude of the peak current (Ipeak), if the calculated time (ΔT) is below said target time threshold (ΔT0) and if the value of the maximum amplitude of the peak current (Ipeak) is below the maximum threshold (Ipeak_max), a step (S5) of increasing the value of the maximum amplitude of the peak current (Ipeak).

2. The method as claimed in claim 1, wherein the target time threshold (ΔT0) is between 200 and 500 μs.

3. The method as claimed in claim 1, wherein the value of the maximum amplitude of the peak current (Ipeak) is decreased by decrementing by a predefined value corresponding to a fraction of the maximum amplitude threshold (Ipeak_max) of the peak current (Ipeak).

4. The method as claimed in claim 1, wherein the value of the maximum amplitude of the peak current (Ipeak) is increased by incrementing by a predefined value corresponding to a fraction of the maximum amplitude threshold (Ipeak_max) of the peak current (Ipeak).

5. The method as claimed in claim 1, furthermore comprising a step (S6) of measuring the time elapsed from the drop time (T2) and, when the output voltage (Vout) has not crossed the predefined high voltage threshold (VTH_high) at the end of a predefined time threshold referred to as the "rise" threshold (ΔT2), a step (S7) of increasing the value of the maximum amplitude of the peak current (Ipeak) to the maximum threshold (Ipeak_max).

6. A DC-DC voltage converter (1) for current-driving at least one fuel injector (2) of a motor vehicle internal combustion engine, said converter (1) comprising a control module (10) and an induction coil (20) that is connected to a field-effect transistor (30) comprising a drain (D), a source (S) and a gate (G), said gate (G) being connected to the control module (10) in order for said control module (10) to command the transistor (30) to an on state in which current passes between the drain (D) and the source (S) or to an off state in which current does not pass between the drain (D) and the source (S), the alternation of the on and off states of the transistor (30) generating a sawtooth current called the peak current (Ipeak), the amplitude of which varies between 0 and a variable maximum amplitude value that is bounded by a minimum threshold (Ipeak_min) and a maximum threshold (Ipeak_max) and that allows the converter (1) to deliver an output voltage (Vout) across the terminals of a capacitor referred to as the "intermediate" capacitor (Cint), the discharging of which is commanded by a computer via a drive module in order to command at least one fuel injector (2), the converter (1) being configured to make said output voltage (Vout) tend toward a target value, the converter (1) being configured to:

determine a time referred to as the "recovery" time (T1) at which the output voltage (Vout) crosses the predefined high voltage threshold (VTH_high), determine a time referred to as the "drop" time (T2), corresponding to the start of injection, at which the output voltage (Vout) decreases below the predefined high voltage threshold (VTH_high), calculate the time (ΔT) elapsed between the recovery time (T1) and the drop time (T2), if the calculated time (ΔT) is above a predefined time threshold, referred to as the "target" time threshold (ΔT0), and if the value of the maximum amplitude of the peak current (Ipeak) is above the minimum threshold (Ipeak_min), decrease the value of the maximum amplitude of the peak current (Ipeak), if the calculated time (ΔT) is below said target time threshold (ΔT0) and if the value of the maximum amplitude of the peak current (Ipeak) is below the maximum threshold (Ipeak_max), increase the value of the maximum amplitude of the peak current (Ipeak).

7. The converter (1) as claimed in claim 6, wherein the target time threshold (ΔT0) is between 200 and 500 μs.

8. The converter (1) as claimed in claim 6, wherein the converter (1) is configured to:

decrease the value of the maximum amplitude of the peak current (Ipeak) by decrementing by a predefined value corresponding to a fraction of the maximum amplitude threshold (Ipeak_max) of the peak current (Ipeak), increase the value of the maximum amplitude of the peak current (Ipeak) by incrementing by a predefined value corresponding to a fraction of the maximum amplitude threshold (Ipeak_max) of the peak current (Ipeak).

9. The converter (1) as claimed in claim 6, said converter (1) being furthermore configured to measure the time elapsed from the drop time (T2) and, when the output voltage (Vout) has not crossed the predefined high voltage threshold (VTH_high) at the end of a predefined time threshold referred to as the "rise" threshold (ΔT2), increase the value of the maximum amplitude of the peak current (Ipeak) to the maximum threshold (Ipeak_max).

10. A motor vehicle comprising a converter (1) as claimed in claim 6.

11. The method as claimed in claim 2, wherein the value of the maximum amplitude of the peak current (Ipeak) is decreased by decrementing by a predefined value corresponding to a fraction of the maximum amplitude threshold (Ipeak_max) of the peak current (Ipeak).

12. The method as claimed in claim 2, wherein the value of the maximum amplitude of the peak current (Ipeak) is increased by incrementing by a predefined value corresponding to a fraction of the maximum amplitude threshold (Ipeak_max) of the peak current (Ipeak).

13. The method as claimed in claim 3, wherein the value of the maximum amplitude of the peak current (Ipeak) is increased by incrementing by a predefined value corresponding to a fraction of the maximum amplitude threshold (Ipeak_max) of the peak current (Ipeak).

14. The method as claimed in claim 2, furthermore comprising a step (S6) of measuring the time elapsed from the drop time (T2) and, when the output voltage (Vout) has not crossed the predefined high voltage threshold (VTH_high) at the end of a predefined time threshold referred to as the "rise" threshold ($\Delta T2$), a step (S7) of increasing the value of the maximum amplitude of the peak current (Ipeak) to the maximum threshold (Ipeak_max).

15. The method as claimed in claim 3, furthermore comprising a step (S6) of measuring the time elapsed from the drop time (T2) and, when the output voltage (Vout) has not crossed the predefined high voltage threshold (VTH_high) at the end of a predefined time threshold referred to as the "rise" threshold ($\Delta T2$), a step (S7) of increasing the value of the maximum amplitude of the peak current (Ipeak) to the maximum threshold (Ipeak_max).

16. The method as claimed in claim 4, furthermore comprising a step (S6) of measuring the time elapsed from the drop time (T2) and, when the output voltage (Vout) has not crossed the predefined high voltage threshold (VTH_high) at the end of a predefined time threshold referred to as the "rise" threshold ($\Delta T2$), a step (S7) of increasing the value of the maximum amplitude of the peak current (Ipeak) to the maximum threshold (Ipeak_max).

17. The converter (1) as claimed in claim 7, wherein the converter (1) is configured to:
decrease the value of the maximum amplitude of the peak current (Ipeak) by decrementing by a predefined value corresponding to a fraction of the maximum amplitude threshold (Ipeak_max) of the peak current (Ipeak),
increase the value of the maximum amplitude of the peak current (Ipeak) by incrementing by a predefined value corresponding to a fraction of the maximum amplitude threshold (Ipeak_max) of the peak current (Ipeak).

18. The converter (1) as claimed in claim 7, said converter (1) being furthermore configured to measure the time elapsed from the drop time (T2) and, when the output voltage (Vout) has not crossed the predefined high voltage threshold (VTH_high) at the end of a predefined time threshold referred to as the "rise" threshold ($\Delta T2$), increase the value of the maximum amplitude of the peak current (Ipeak) to the maximum threshold (Ipeak_max).

19. The converter (1) as claimed in claim 8, said converter (1) being furthermore configured to measure the time elapsed from the drop time (T2) and, when the output voltage (Vout) has not crossed the predefined high voltage threshold (VTH_high) at the end of a predefined time threshold referred to as the "rise" threshold ($\Delta T2$), increase the value of the maximum amplitude of the peak current (Ipeak) to the maximum threshold (Ipeak_max).

20. A motor vehicle comprising a converter (1) as claimed in claim 7.

* * * * *